(12) United States Patent
Lee et al.

(10) Patent No.: US 8,476,093 B2
(45) Date of Patent: Jul. 2, 2013

(54) METHOD OF MANUFACTURING A DISPLAY SUBSTRATE

(75) Inventors: Jung-Soo Lee, Seoul (KR); Jeong-Min Park, Seoul (KR); Ji-Hyun Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 182 days.

(21) Appl. No.: 13/166,706

(22) Filed: Jun. 22, 2011

(65) Prior Publication Data

US 2012/0171793 A1  Jul. 5, 2012

(30) Foreign Application Priority Data

Dec. 31, 2010  (KR) .................. 10-2010-0139830

(51) Int. Cl.
    *H01L 33/36* (2010.01)
(52) U.S. Cl.
    USPC .............................. 438/34; 438/42
(58) Field of Classification Search
    USPC ...................................... 438/34, 42
    See application file for complete search history.

(56) References Cited

U.S. PATENT DOCUMENTS

| | | | |
|---|---|---|---|
| 2008/0150434 A1* | 6/2008 | Sung et al. | 315/169.3 |
| 2012/0104404 A1* | 5/2012 | Kwack et al. | 257/72 |
| 2012/0138938 A1* | 6/2012 | Bae et al. | 257/59 |
| 2012/0140155 A1* | 6/2012 | Yun | 349/106 |
| 2012/0242632 A1* | 9/2012 | Park et al. | 345/205 |
| 2013/0020591 A1* | 1/2013 | Park et al. | 257/88 |

FOREIGN PATENT DOCUMENTS

| KR | 1020100006678 | 1/2010 |
|---|---|---|
| KR | 1020100025837 | 3/2010 |
| KR | 1020100058976 | 6/2010 |

\* cited by examiner

*Primary Examiner* — Alexander Ghyka
*Assistant Examiner* — Stanetta Isaac
(74) *Attorney, Agent, or Firm* — Innovation Counsel LLP

(57) ABSTRACT

A method of manufacturing a display substrate includes forming a common electrode line, a gate line, a data line and a switching element connected to the gate and data lines on an insulation substrate. A first pixel electrode and an insulation layer are sequentially formed on the insulation substrate. A first photoresist pattern having a first hole and a second hole is formed from a first photoresist layer on the insulation substrate. A first transparent electrode layer is coated on the insulation substrate. A second photoresist layer is coated on the insulation substrate. The second photoresist layer is exposed and developed to form a second photoresist pattern remaining in the first hole and the second hole. The first transparent electrode layer is patterned using the second photoresist pattern, to form a second pixel electrode.

20 Claims, 8 Drawing Sheets

METHOD OF MANUFACTURING A DISPLAY SUBSTRATE

CROSS-REFERENCE TO RELATED APPLICATION

This application claims priority under 35 U.S.C. §119 to Korean Patent Application No. 2010-139830, filed on Dec. 31, 2010 in the Korean Intellectual Property Office (KIPO), the contents of which are herein incorporated by reference in their entirety.

BACKGROUND

1. Field of the Invention

The subject matter disclosed herein relates to a method of manufacturing a display substrate. More particularly, the subject matter relates to a method of manufacturing a display substrate decreasing a processing time to enhance a yield.

2. Description of the Related Art

Generally, a liquid crystal display (LCD) panel includes a display substrate, an opposite substrate facing the display substrate and a liquid crystal layer disposed between the display substrate and the opposite substrate. The display substrate includes a display area in which a plurality of signal lines and a plurality of transistors connected to the signal lines are formed, and a peripheral area in which a plurality of pads supplying an electric signal to the signal lines is formed.

Originally, an LCD panel using a twisted nematic (TN) mode was a popular choice. Recently however, an LCD panel using a plane to line switching (PLS) mode has been the more popular choice due to a wider viewing angle.

In the LCD panel using the PLS mode, liquid crystal molecules horizontally arranged by a fringe filed between a common electrode and a pixel electrode displays a grayscale.

A display substrate of the LCD panel using the PLS mode includes gate and data lines, a thin film transistor (TFT) connected to the gate and data lines, and the pixel electrode connected to the TFT.

The TFT includes a gate electrode connected to the gate line, a semiconductor layer forming a channel, a source electrode connected to the data line and a drain electrode facing the source electrode. The TFT is a switching element controlling an image signal applied to the pixel electrode through the data line according to a gate signal applied through the gate line.

However, the display substrate is formed via a plurality of complicated and detailed photo etching processes that determine a manufacturing time and a manufacturing cost for the display substrate. In addition, the manufacturing process for the display substrate includes a semiconductor process and a plurality of mask processes. Accordingly, there is need for a method to simplify and reduce the number of the photo etching processes to decrease total manufacturing time and total manufacturing cost for the display substrate.

SUMMARY

Example embodiments of the claimed subject matter provide a method of manufacturing a display substrate capable of simplifying a manufacturing process and decreasing a manufacturing time.

According to an example embodiment of the claimed subject matter, a method of manufacturing a display substrate includes forming a common electrode line, a gate line, a data line and a switching element connected to the gate and data lines on an insulation substrate. A first pixel electrode and an insulation layer are sequentially formed on the insulation substrate on which the switching element is formed. A first photoresist pattern is formed from a first photoresist layer on the insulation substrate on which the insulation layer is formed. The first photoresist pattern includes a first hole and a second hole formed through the first photoresist pattern. The first contact hole exposes the common electrode line, and the second hole exposes the first pixel electrode. A first transparent electrode layer is coated on the insulation substrate on which the first photoresist pattern is formed. A second photoresist layer is coated on the insulation substrate on which the first transparent electrode layer is formed. The second photoresist layer is exposed and developed to form a second photoresist pattern remaining in the first hole and the second hole. The first transparent electrode layer is patterned using the second photoresist pattern, to form a second pixel electrode making contact with the common electrode line and including a plurality of openings formed through the second pixel electrode.

In an example embodiment, a portion of the first transparent electrode layer corresponding to the first hole and the second hole of the first photoresist pattern may form the second pixel electrode.

In an example embodiments, the first photoresist pattern may be formed using a first mask, and the first mask may include a blocking portion disposed over the switching element, a transmissive portion disposed over the common electrode line, and a slit pattern disposed over the first pixel electrode.

In an example embodiment, forming the first photoresist pattern may further include patterning the first photoresist layer to form a first sub photoresist pattern including a first sub hole and a plurality of recess portions. The first sub hole may be formed using the transmissive portion and expose the insulation layer corresponding to the common electrode line. The recess portions may be formed by the slit pattern and disposed on the first pixel electrode. The first hole may be formed through the insulation layer using the first sub photoresist pattern as an etch stopping layer. The first sub photoresist pattern may be entirely etched back to form the first photoresist pattern.

In an example embodiment, a depth of each of the recess portions may be smaller than that of the first hole.

In an example embodiment, forming the first photoresist pattern may include forming the second holes exposing the insulation layer on the first pixel electrode by etching back the recess portions.

In an example embodiment, a thickness of the second photoresist layer may be larger than the depth of the recess portions.

In an example embodiment, forming the second photoresist pattern may include entirely exposing the second photoresist layer.

In an example embodiment, forming the second pixel electrode may include patterning the first transparent electrode layer by a wet etching.

In an example embodiment, the first and second photoresist patterns may be removed using a stripper.

In an example embodiment, forming the switching element may include forming a gate metal layer on the insulation substrate and patterning the gate metal layer to form the gate line, the common electrode line, and a control terminal of the switching element.

In an example embodiment, a semiconductor pattern may be formed on the control terminal of the switching element.

In an example embodiment, first and second semiconductor layers and a data metal layer may be sequentially formed on the insulation substrate on which the gate line, the common electrode line and the control terminal of the switching element are formed. The first and second semiconductor layers and the data metal layer may be patterned, to form an input terminal of the switching element, an output terminal of the switching element and the data line connected to the input terminal of the switching element.

In an example embodiment, forming the input terminal of the switching element, the output terminal of the switching element and the data line may include coating a third photoresist layer on the data metal layer. The third photoresist layer may be patterned to form a third sub photoresist pattern including a first portion having a first height and a second portion having a second height. The first and second semiconductor layers and the data metal layer may be etched using the third sub photoresist pattern as an etch stopping layer.

In an example embodiment, forming the input terminal of the switching element, the output terminal of the switching element and the data line may include etching the third sub photoresist pattern to form a third photoresist pattern exposing the data metal layer. The first and second semiconductor layers and the data metal layer may be etched using the third photoresist pattern as an etching stopping layer to expose the first semiconductor layer.

In an example embodiment, the third photoresist pattern may be patterned using a second mask, and the second mask may include a blocking portion disposed over the input and output terminals of the switching element and a transflective portion disposed over the semiconductor pattern between the input and output terminals of the switching element.

In an example embodiment, a gate insulation layer covering the gate line, the common electrode line and the control terminal of the switching element may be formed.

In an example embodiment, forming the first hole may include partially removing the gate insulation layer disposed over the common electrode line.

In an example embodiment, sequentially forming the first pixel electrode and the insulation layer may include forming a second transparent electrode layer on the insulation substrate on which the switching element is formed. The second transparent electrode layer may be patterned to form the first pixel electrode directly making contact with an output terminal of the switching element. The insulation layer may be formed on the insulation substrate on which the first pixel electrode is formed.

In an example embodiment, each of the first and second photoresist layers may include a photo sensitive material.

According to the present invention, a photoresist layer is patterned using a developing process, so that a time loss due to moving the mother substrate from one track to another track and the process time for moving the mother substrate may be decreased. In addition, after patterning a first photoresist layer to have a form substantially same as that of an electrode, a second photoresist layer is coated, so that a fine pattern may be easily and precisely formed.

BRIEF DESCRIPTION OF THE DRAWINGS

The above and other features and advantages of the claimed subject matter will become more apparent by describing in detailed example embodiments thereof with reference to the accompanying drawings, in which:

DETAILED DESCRIPTION

Hereinafter, the claimed subject matter will be explained in detail with reference to the accompanying drawings.

Figure 1:
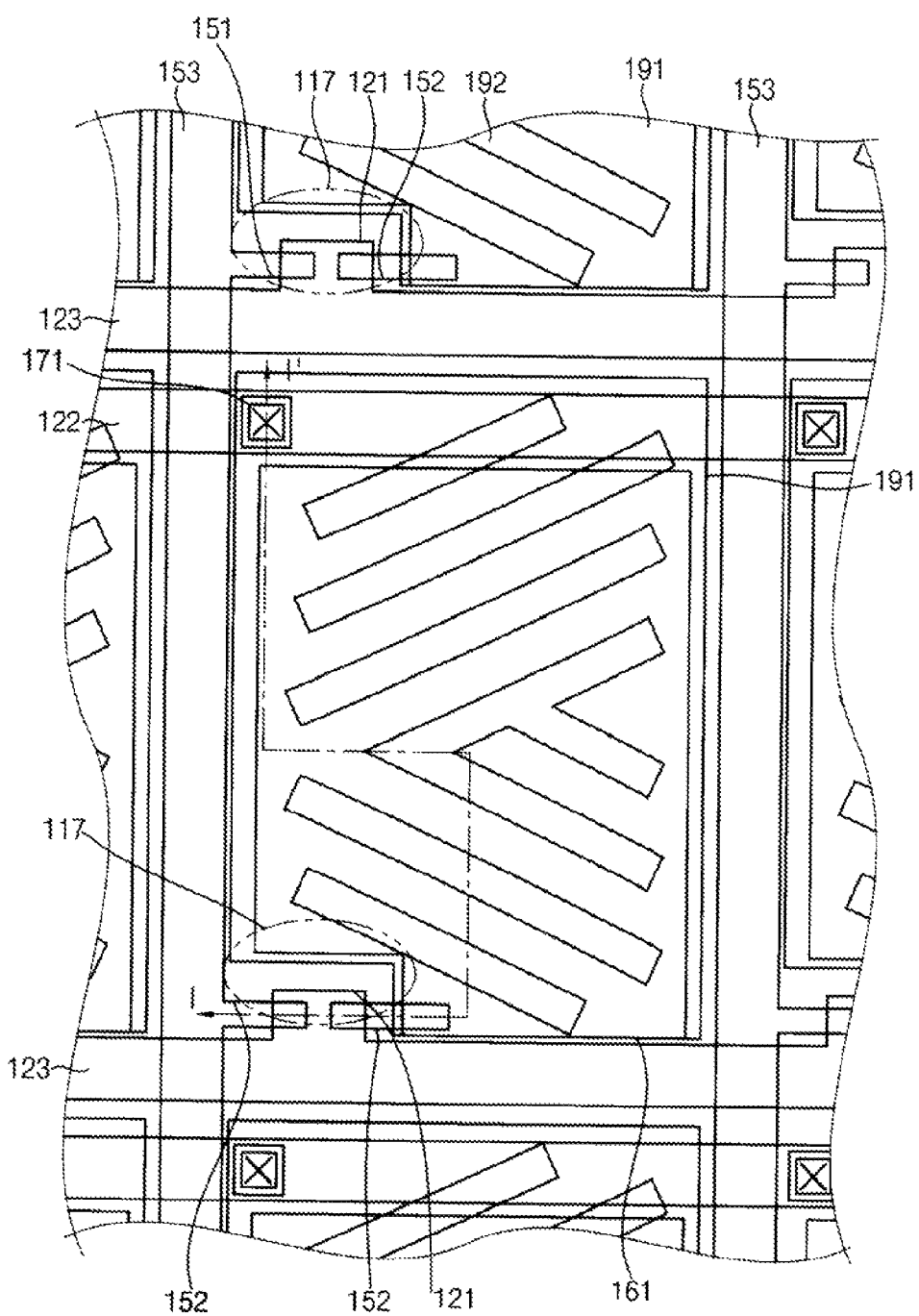
FIG. 1 is a plan view illustrating a display panel according to an example embodiment.
Figure 2:
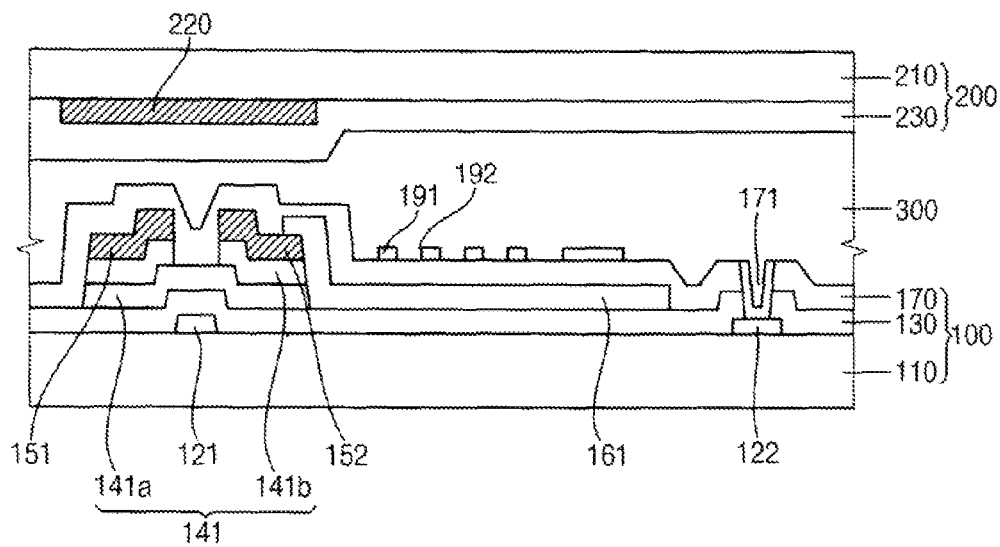
FIG. 2 is a cross-sectional view illustrating the display panel taken along a line I-I' of FIG. 1.

FIG. 1 is a plan view illustrating a display panel according to an example embodiment. FIG. 2 is a cross-sectional view illustrating the display panel taken along a line I-I' of FIG. 1.

Referring to FIGS. 1 and 2, a display panel 100 includes a plurality of pixels. The pixels are defined by an area in which data and gate lines 153 and 123 cross each other and a pixel electrode is formed.

Each of the pixels includes a switching element 117 and first and second pixel electrodes 161 and 191. The switching element 117 includes a gate electrode 121, a semiconductor pattern 141, a source electrode 151, and a drain electrode 152.

The gate electrode 121, a common electrode line 122, and a gate line 123 are formed on a lower insulating substrate 110. The gate electrode 121 is extended from the gate line 123, and is formed in the pixel. The common electrode line 122 is substantially parallel with the gate line 123.

A gate insulation layer 130 is formed on the lower insulating substrate 110 on which the gate line 123 and the gate electrode 121 are formed. The gate insulation layer 130 may include an insulation material transmitting light. Examples of the insulation material may include silicon nitride, silicon oxide and so on.

The semiconductor pattern 141 is formed on the gate insulation layer 130. The semiconductor pattern 141 includes an amorphous silicon pattern 141a and an n+ amorphous silicon pattern 141b. The amorphous silicon pattern 141a and the n+ amorphous silicon pattern 141b are sequentially formed. The semiconductor pattern 141 overlaps with the gate electrode 121.

The data lines 153, the source electrode 151 and the drain electrode 152 are formed on the gate insulation layer 130. Each of the source and drain electrodes 151 and 152 partially overlaps with the semiconductor pattern 141. The source and drain electrodes 151 and 152 are separated from each other. The source electrode 151 is extended from the data line 153, and the drain electrode 152 is electrically connected to the first pixel electrode 161.

The first pixel electrode 161 is formed on the lower insulating substrate 110 on which the switching element 117 and the data line 153 are formed. The first pixel electrode 161 directly makes contact with the drain electrode 152. The first pixel electrode 161 may include a transparent conductive oxide material. Examples of the transparent conductive oxide material may include indium tin oxide (ITO), indium zinc oxide (IZO) and so on.

A passivation layer 170 is formed on the lower insulating substrate 110 on which the first pixel electrode 161 is formed. The passivation layer 170 covers the first pixel electrode 161. The passivation layer 170 includes a first contact hole 171 formed through the passivation layer 170 and the common electrode line 122 is exposed through the first contact hole 171. The passivation layer 170 may include an insulation material transmitting light. Examples of the insulation material may include silicon nitride, silicon oxide and so on.

A second pixel electrode 191 overlapping with the first pixel electrode 161 is formed on the lower insulating substrate 110 on which the passivation layer 170 is formed. The second pixel electrode 191 includes a plurality of bar shape electrodes and a plurality of openings 192 formed between the bar shape electrodes. The second pixel electrode 191 may include a transparent conductive oxide material. Examples of the transparent conductive oxide material may include indium tin oxide (ITO), indium zinc oxide (IZO) and so on.

An upper substrate 200 includes an upper insulation substrate 210, a light blocking layer 220 and a color filter 230. The display panel includes a liquid crystal layer formed between the display substrate 100 and the upper substrate 200.

Figure 3A:
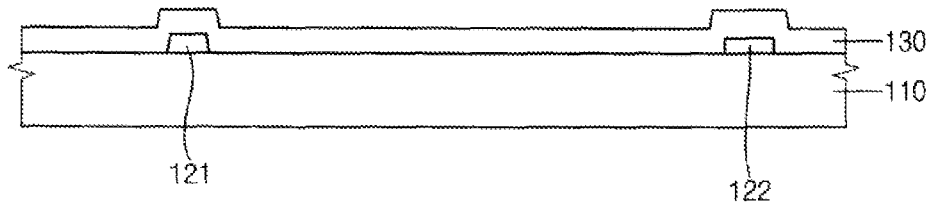
FIGS. 3A to 3O are cross-sectional views for explaining a method for manufacturing a display substrate of FIG. 1.
Figure 3B:
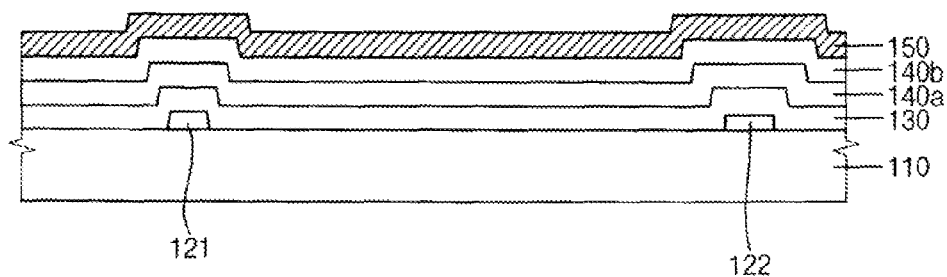
Figure 3C:
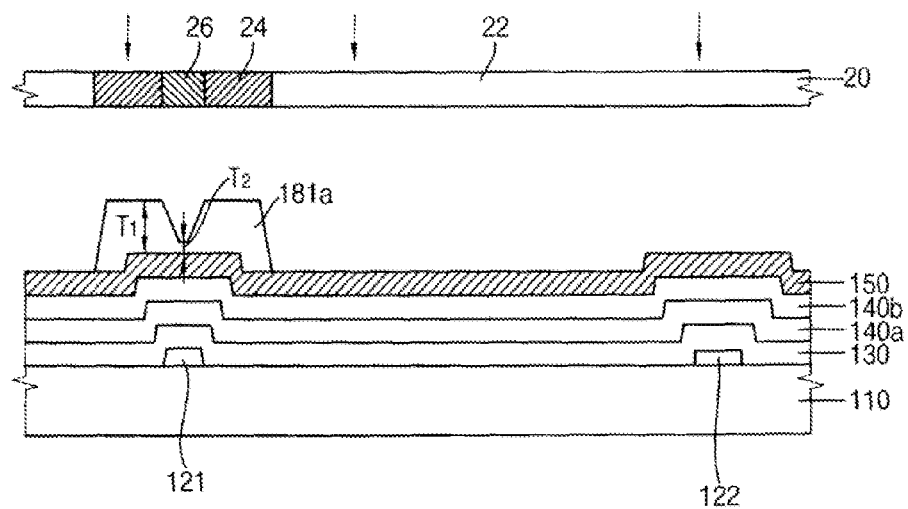
Figure 3D:
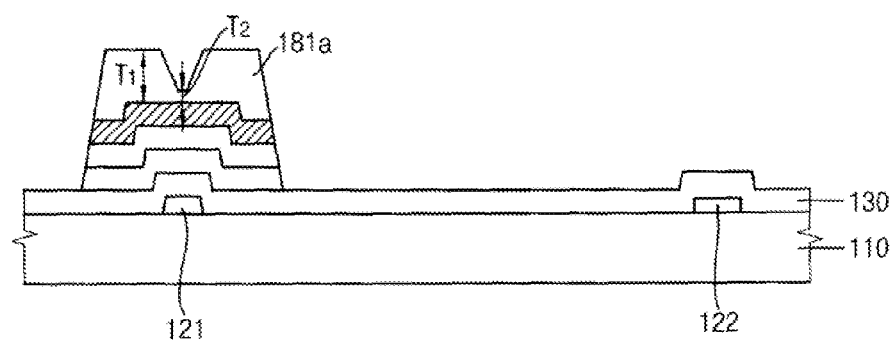
Figure 3E:
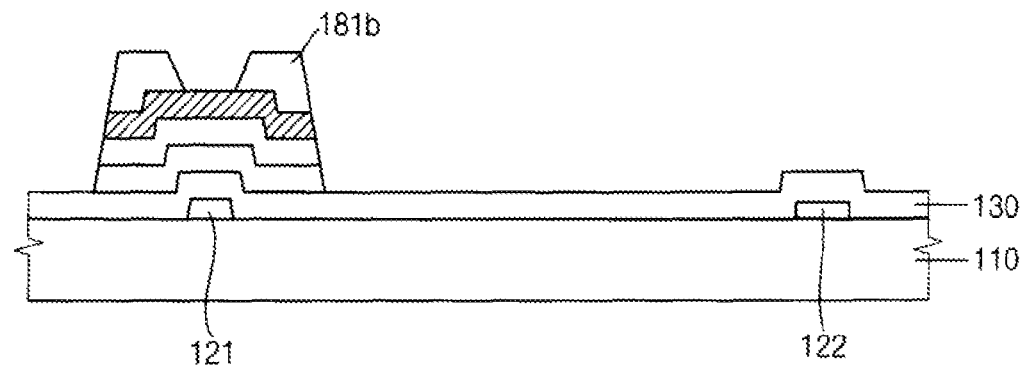
Figure 3F:
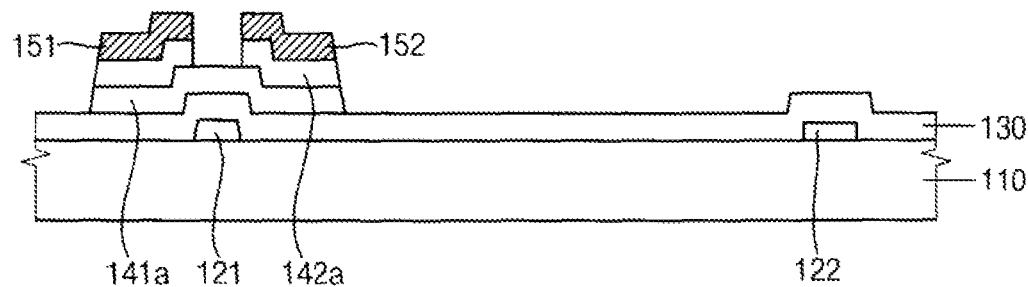
Figure 3G:
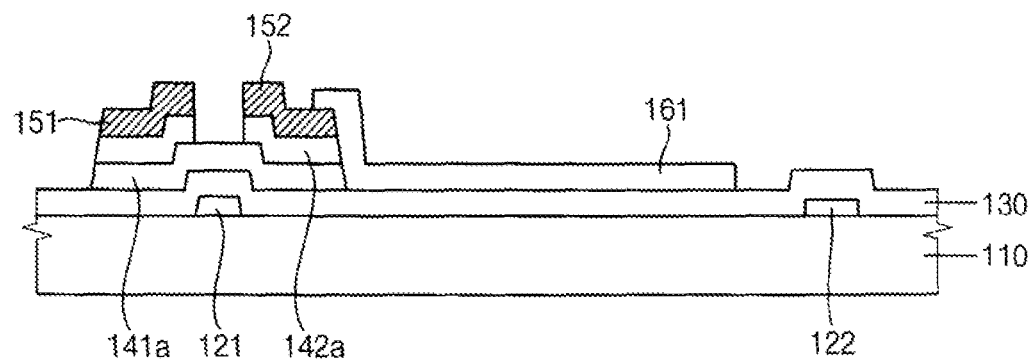
Figure 3H:
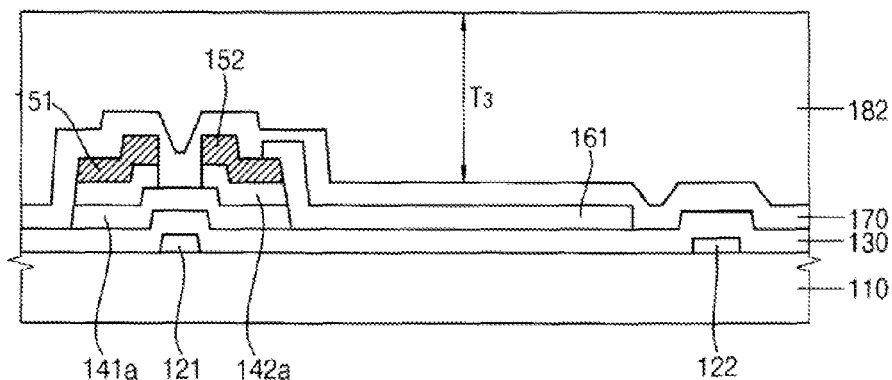
Figure 3I:
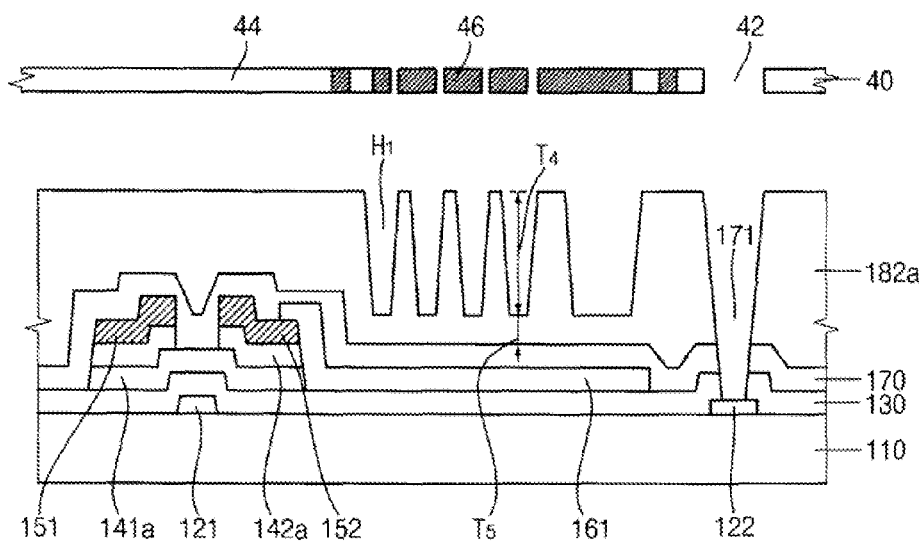
Figure 3J:
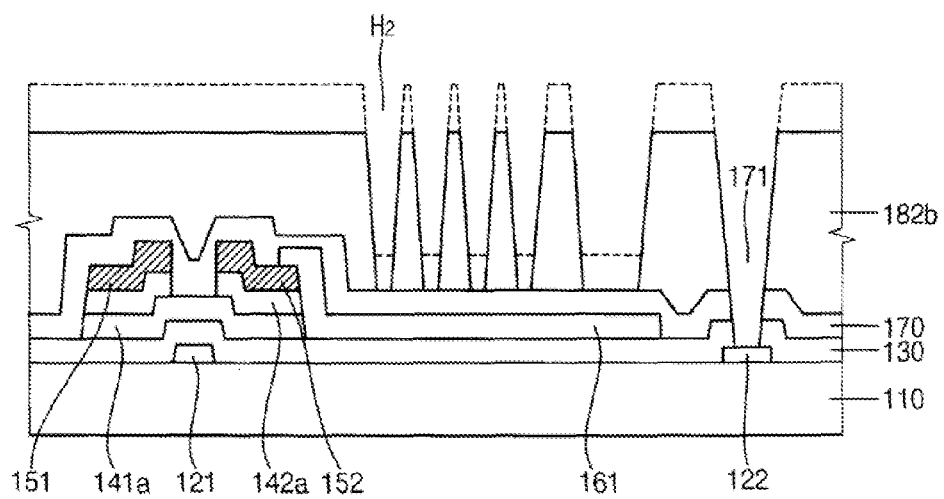
Figure 3K:
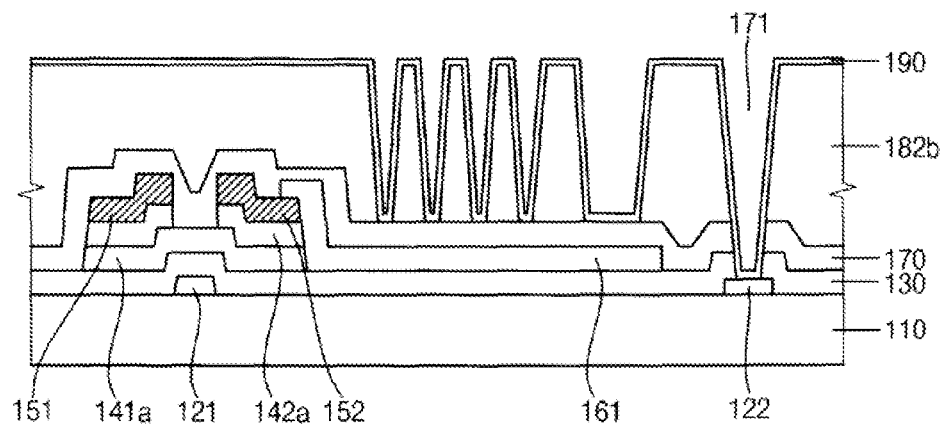
Figure 3L:
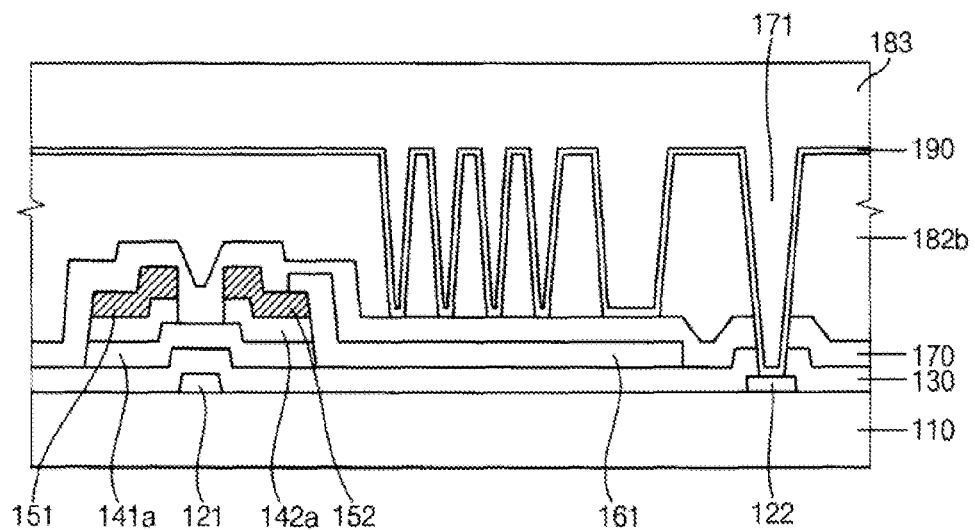
Figure 3M:
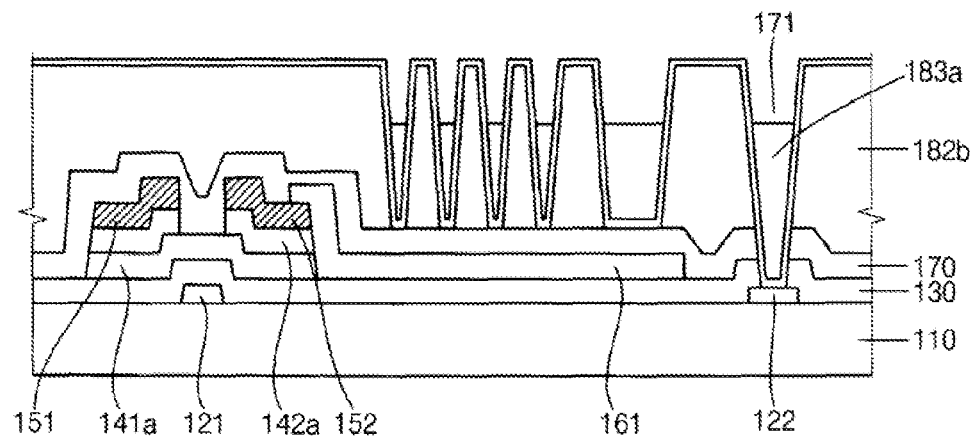
Figure 3N:
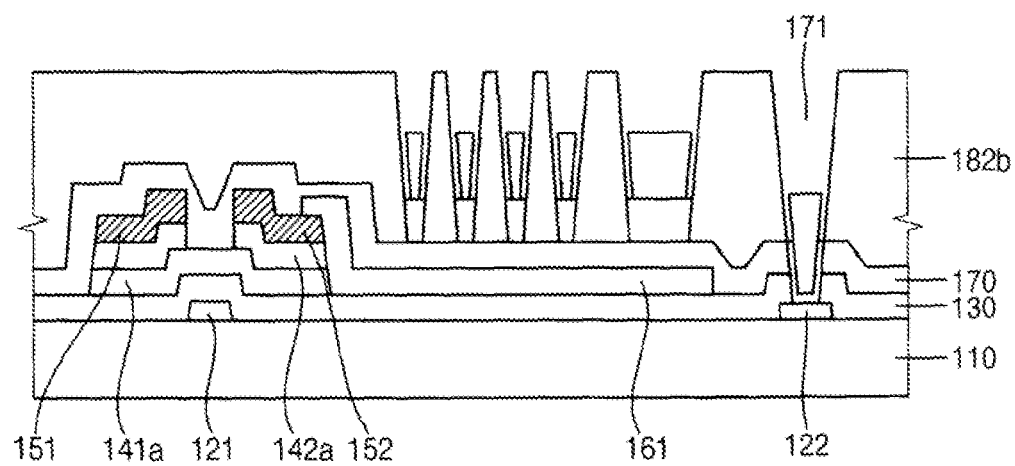
Figure 3O:
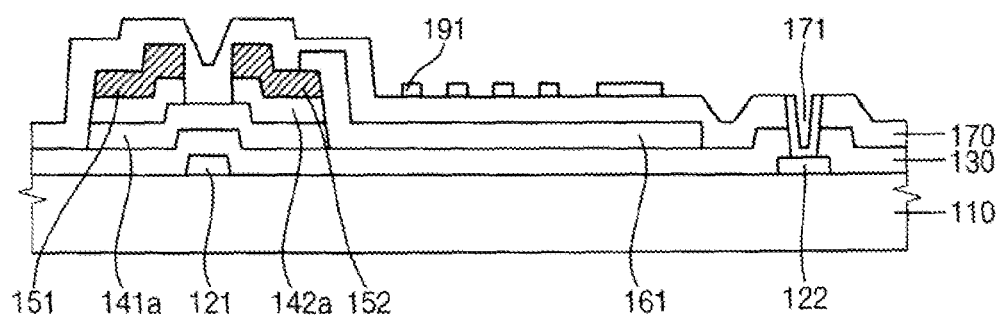

FIGS. 3A to 3O are cross-sectional views for explaining a method for manufacturing a display substrate of FIG. 1.

Referring to FIGS. 1, 2 and 3A, the gate metal layer (not shown) is formed on the lower insulation substrate 110. The gate metal layer may be formed using a sputtering method. The gate metal layer may have a single-layered structure or a double-layered structure.

Then, the gate metal layer is etched via a photo etching process using a first mask (not shown), to form the first gate electrode 121, the common electrode line 122 and the gate line 123.

The gate insulation layer 130 is formed on the lower insulation substrate 110 on which the first gate electrode 121, the common electrode line 122 and the gate line 123 are formed. The gate insulation layer 130 may be deposited via a plasma enhanced chemical vapor deposition (PECVD) method. The gate insulation layer 130 may include an insulation material transmitting light. Examples of the insulation material may include silicon nitride, silicon oxide and so on. In addition, the gate insulation layer 130 may have a double-layered structure having two layers formed from different materials and formed by different processes.

Referring to FIGS. 1, 2 and 3B, a primitive amorphous silicon layer 140a and an n+ amorphous silicon layer 140b are formed on the lower insulation substrate 110 on which the gate insulation layer 130 is formed. The primitive amorphous silicon layer 140a and the n+ amorphous silicon layer 140b may be formed via the PECVD method at the same time.

Alternatively, the n+ amorphous silicon layer 140b is formed by dropping n+ ions into an upper portion of the primitive amorphous silicon layer 140a.

Then, a data metal layer 150 is formed on the lower insulation substrate 110 on which the n+ amorphous silicon layer 140b is formed. Examples of a material that may be used for the data metal layer 150 may include chromium (Cr), aluminum (Al), tantalum (Ta), molybdenum (Mo), titanium (Ti), tungsten (W), copper (Cu), silver (Ag) and alloys thereof. The data metal layer 150 may be coated by the sputtering method.

Referring to FIGS. 1, 2 and 3C, a first photoresist pattern 181a is formed on the lower insulation substrate 110 on which the data metal layer 150 is formed. The first photoresist pattern 181a is formed by forming a first photoresist layer (not shown) on the insulating substrate 110 on which the data metal layer 150 is formed, exposing the first photoresist layer using a second mask 20 and developing the first photoresist layer. In the present example embodiment, a positive photoresist material is used, but alternatively a negative photoresist material may be used.

The second mask 20 includes a transmissive portion 22 transmitting light, a blocking portion 24 blocking the light, and a transflective portion 26 partially transmitting the light.

A portion of the first photoresist layer corresponding to the transmissive portion 22 is removed by a developer.

A portion of the first photoresist layer corresponding to the blocking portion 24 is not removed by a developer and remains on the data metal layer 150 with a first thickness T1. The first thickness T1 may be substantially same as an initial thickness of the first photoresist layer.

A portion of the first photoresist layer disposed over the transflective portion 26 is partially removed by the developer, and partially remains. Thus, the portion of the first photoresist layer disposed over the transflective portion 26 remains with a second thickness T2. The second thickness T2 is thinner than the first thickness T1.

Accordingly, the first photoresist pattern 181a is formed on the data metal layer 150.

Referring to FIGS. 1, 2 and 3D, the data metal layer 150, the primitive amorphous silicon layer 140a and the n+ amorphous silicon layer 140b are etched using the first photoresist pattern 181a as an etch stopping layer.

The data metal layer 150, the primitive amorphous silicon layer 140a and the n+ amorphous silicon layer 140b are partially etched, so that a portion of the data metal layer 150, a portion of the primitive amorphous silicon layer 140a and a portion of the n+ amorphous silicon layer 140b which are covered by the first photoresist pattern 181a.

Referring to FIGS. 1, 2 and 3E, the first photoresist pattern 181a is removed as much as the second thickness T2 to form a second photoresist pattern 181b. The second photoresist pattern 181b exposes a portion of the data metal layer 150.

Referring to FIGS. 1, 2 and 3F, the data metal layer 150 and the n+ amorphous silicon layer 140b are etched using the second photoresist pattern 181b as an etch stopping layer to remove a portion of the data metal layer 150 and the n+ amorphous silicon layer 140b. Thus, a portion of the primitive amorphous silicon layer 140a is exposed by removing the portion of the data metal layer 150 and the n+ amorphous silicon layer 140b.

Thus, the source electrode 151, a drain electrode 152 spaced apart from the source electrode 151, and the semiconductor pattern 141 are formed on the insulating substrate 110.

Referring to FIGS. 1, 2 and 3G, a first transparent electrode layer (not shown) is formed on the lower insulation layer 110. The first transparent electrode layer may include a transparent conductive oxide material. The first transparent electrode layer may be deposited by the sputtering method.

Then, the first transparent electrode layer is etched via a photo etching process using a third mask (not shown) to form the first pixel electrode 161. The first pixel electrode 161 is formed on an area overlapping with the pixel. The first pixel electrode 161 directly makes contact with the drain electrode 152. The first pixel electrode 161 receives a data voltage through the drain electrode 152.

Referring to FIGS. 1, 2 and 3H, the passivation layer 170 covering the first pixel electrode 161 is formed on the lower insulation substrate 110. The passivation layer 170 may include an insulation material transmitting the light.

The passivation layer 170 may be formed via the PECVD method.

Then, the second photoresist layer 182 is formed on the passivation layer 170. The second photoresist layer 182 is coated on the insulating substrate 110 with a constant thickness. For example, the second photoresist layer 182 has a third thickness T3 on the first pixel electrode 161.

Referring to FIGS. 1, 2 and 3I, a fourth mask 40 is arranged over the second photoresist layer 182. A third photoresist pattern 182a is formed by exposing the second photoresist layer 182 using the fourth mask 40 and developing the second photoresist layer 182.

The fourth mask 40 includes a transmissive portion 42 transmitting the light, a blocking portion 44 blocking the light and a transflective portion 46 partially transmitting the light. The transflective portion 46 may include a slit pattern.

The transmissive portion 42 is arranged over the common electrode line 122 formed on the lower insulation substrate 110. Thus, a portion of the second photoresist layer 182 disposed below the transmissive portion 42 is removed by a developer to expose the passivation layer 170.

The blocking portion 44 is arranged in an area in which the switching element 117 is formed on the lower insulation substrate 110. A portion of the second photoresist layer 182 corresponding to the blocking portion 44 is not removed by a developer and remains.

The transflective portion 46 is arranged over the first pixel electrode 161 formed on the lower insulation substrate 110. A portion of the second photoresist layer 182 disposed below the transflective portion 46 is partially removed by the developer, and the portion of the second photoresist layer 182 disposed below the transflective portion 46 partially remains. Thus, the portion of the second photoresist layer 182 disposed below the transflective portion 46 has a plurality of recess portions H1. The recess portions H1 are separated from each other by a certain distance. A portion of the second photoresist layer 182 formed on the first pixel electrode 161 is removed as much as a fourth thickness T4 to form the recess portions H1. A portion of the second photoresist layer 182 disposed below the recess portion H1 has a fifth thickness T5. The fifth thickness T5 is substantially the same as a difference between the third thickness T3 and the fourth thickness T4.

Accordingly, the third photoresist pattern 182a is formed.

Referring to FIGS. 1, 2 and 3J, the passivation layer 170 is etched using the third photoresist pattern 182a as an etch stopping layer to form the first contact hole 171 over the insulating substrate 110. The first contact hole 171 exposes the common electrode line 122.

In addition, the passivation layer 170 is etched by an entire etch back process. Thus, a portion of the second photoresist layer 182 disposed in the recess portion H1 are removed to form first holes H2 exposing the passivation layer 170. Thus, the fourth photoresist pattern 182b is formed.

Referring to FIGS. 1, 2 and 3K, a second transparent electrode layer 190 is formed on the fourth photoresist pattern 182b. The second transparent electrode layer 190 covers the passivation layer 170 exposed by the first holes H2. The second transparent electrode layer 190 may include a transparent conductive oxide material. Examples of the transparent conductive oxide material may include indium tin oxide (ITO), indium zinc oxide (IZO) and so on. The second transparent electrode layer 190 may be deposited by a sputtering method.

Referring to FIGS. 1, 2 and 3L, a third photoresist layer 183 is formed on the lower insulation layer 110 on which the second transparent electrode layer 190 is formed. A thickness of the third photoresist layer 183 on the first pixel electrode 161 is thicker than the third thickness T3. Thus, the third photoresist layer 183 fills the first holes H2 and the first contact hole 171, and covers the second transparent electrode layer 190.

Referring to FIGS. 1, 2 and 3M, the third photoresist layer 183 is exposed. Then, a developer is coated on the third photoresist layer 183, and the third photoresist layer 183 is patterned by exposing and developing the third photoresist layer 183.

Here, a portion of the third photoresist layer 183 filling portions of the first holes H2 and the first contact hole 171 remains, and the rest of the third photoresist layer 183 is removed. Thus, an entire exposing energy is adjusted to remain the portion of the third photoresist layer 183 filling the portions of the first holes H2 and the first contact hole 171.

Instead of coating the developer on the third photoresist layer 183 and patterning the third photoresist layer 183, the third photoresist layer 183 may be patterned by the entire etch back process like the second photoresist layer 182. By the etch back process, the portion of the third photoresist layer 183 filling the portions of the first holes H2 and the first contact hole 171 remains, and the rest of the third photoresist layer 183 is removed.

Accordingly, the fifth photoresist pattern 183a is formed.

Referring to FIGS. 1, 2 and 3N, the second transparent electrode layer 190 is patterned using the fifth photoresist pattern 183a as an etch stopping layer. The second transparent electrode layer 190 may be patterned via a wet etch process.

By etching the second transparent electrode layer 190, the second transparent electrode layer 190 is removed except for a portion of the second transparent electrode layer 190 disposed in the first holes H2 and the first contact hole 171.

Referring to FIGS. 1, 2 and 3O, the fourth and fifth photoresist patterns 182b and 183a are removed. A photoresist stripper is coated on the lower insulation layer 110 on which the second transparent electrode layer 190 is patterned. The photoresist stripper is injected into the fourth and fifth photoresist patterns 182b and 183a to remove the fourth and fifth photoresist patterns 182b and 183a. The second pixel electrode 191 is formed by removing the fourth and fifth photoresist patterns 182b and 183a on the lower insulation layer 110.

Thus, the display panel according to the present example embodiment is completed.

Conventionally, the third photoresist layer 183 is patterned by the entire etch back process using a dry etching. In the entire etch back process, a thickness of the third photoresist layer 183 that should be removed is more than about 13000 Å considering manufacturing conditions, and the dry etching needs much time. In addition, after coating the third photoresist layer 183, a mother substrate including the lower insulation layer 110 is moved to a track in which the dry etching is processed. Thus, moving the mother substrate to the track also needs much time.

However, in the present example embodiment, the third photoresist layer 183 is patterned by the developing process. Thus, a time for the developing process is adjusted according to a developing speed and an entire exposing energy, and patterning the third photoresist layer 183 may need less time. In addition, the developing process is performed in the track in which coating the third photoresist layer 183 on the lower insulation substrate 110 is processed, so that moving the mother substrate may need less time.

In addition, a shape of an electrode due to the third photoresist pattern 182b is the shape of the second pixel electrode 191, so that a fine pattern may be easily and precisely formed after coating the third photoresist layer 183 on the lower insulation substrate 110.

According to the claimed subject matter, a photoresist layer is patterned using a developing process, so that a time loss due to moving the mother substrate from one track to another track and the process time for moving the mother substrate may be decreased. In addition, after patterning a first photoresist layer to have a form substantially the same as that of an electrode, a second photoresist layer is coated, so that a fine pattern may be easily and precisely formed.

The foregoing is illustrative of the claimed subject matter and is not to be construed as limiting thereof. Although a few example embodiments of the have been described, those skilled in the art will readily appreciate that many modifications are possible in the example embodiments without materially departing from the novel teachings and advantages. Accordingly, all such modifications are intended to be included within the scope of the claimed subject matter as defined in the claims. In the claims, means-plus-function clauses are intended to cover the structures described herein as performing the recited function and not only structural equivalents but also equivalent structures. Therefore, it is to be understood that the foregoing is illustrative of the claimed subject matter and is not to be construed as limited to the specific example embodiments disclosed, and that modifications to the disclosed example embodiments, as well as other example embodiments, are intended to be included within the scope of the appended claims. The claimed subject matter is defined by the following claims, with equivalents of the claims to be included therein.

What is claimed is:

1. A method of manufacturing a display substrate, the method comprising:
    forming a common electrode line, a gate line, a data line and a switching element connected to the gate and data lines on an insulation substrate;
    sequentially forming a first pixel electrode and an insulation layer on the insulation substrate on which the switching element is formed;
    forming a first photoresist pattern from a first photoresist layer on the insulation substrate on which the insulation layer is formed, the first photoresist pattern including a first hole and a second hole formed through the first photoresist pattern, the first contact hole exposing the common electrode line, the second hole exposing the first pixel electrode;
    coating a first transparent electrode layer on the insulation substrate on which the first photoresist pattern is formed;
    coating a second photoresist layer on the insulation substrate on which the first transparent electrode layer is formed;
    exposing and developing the second photoresist layer to form a second photoresist pattern remaining in the first hole and the second hole; and
    patterning the first transparent electrode layer using the second photoresist pattern, to form a second pixel electrode making contact with the common electrode line and including a plurality of openings formed through the second pixel electrode.

2. The method of claim 1, wherein a portion of the first transparent electrode layer corresponding to the first hole and the second hole of the first photoresist pattern forms the second pixel electrode.

3. The method of claim 2, wherein the first photoresist pattern is formed using a first mask, and the first mask includes a blocking portion disposed over the switching element, a transmissive portion disposed over the common electrode line, and a slit pattern disposed over the first pixel electrode.

4. The method of claim 3, wherein forming the first photoresist pattern further comprises:
    patterning the first photoresist layer to form a first sub photoresist pattern including a first sub hole and a plurality of recess portions, the first sub hole being formed using the transmissive portion and exposing the insulation layer corresponding to the common electrode line, the recess portions being formed by the slit pattern and disposed on the first pixel electrode;
    forming the first hole through the insulation layer using the first sub photoresist pattern as an etch stopping layer; and
    entirely etching back the first sub photoresist pattern to form the first photoresist pattern.

5. The method of claim 4, wherein a depth of each of the recess portions is smaller than that of the first hole.

6. The method of claim 5, wherein forming the first photoresist pattern comprises forming the second holes exposing the insulation layer on the first pixel electrode by etching back the recess portions.

7. The method of claim 5, wherein a thickness of the second photoresist layer is larger than the depth of the recess portions.

8. The method of claim 5, wherein forming the second photoresist pattern comprises entirely exposing the second photoresist layer.

9. The method of claim 5, wherein forming the second pixel electrode comprises patterning the first transparent electrode layer by a wet etching.

10. The method of claim 5, further comprising removing the first and second photoresist patterns using a stripper.

11. The method of claim 5, wherein forming the switching element comprises:
    forming a gate metal layer on the insulation substrate; and
    patterning the gate metal layer to form the gate line, the common electrode line and a control terminal of the switching element.

12. The method of claim 11, further comprising forming a semiconductor pattern on the control terminal of the switching element.

13. The method of claim 12, further comprising:
    sequentially forming first and second semiconductor layers and a data metal layer on the insulation substrate on which the gate line, the common electrode line and the control terminal of the switching element are formed; and
    patterning the first and second semiconductor layers and the data metal layer, to form an input terminal of the switching element, an output terminal of the switching element and the data line connected to the input terminal of the switching element.

14. The method of claim 13, wherein forming the input terminal of the switching element, the output terminal of the switching element and the data line comprises:
    coating a third photoresist layer on the data metal layer;
    patterning the third photoresist layer to form a third sub photoresist pattern including a first portion having a first height and a second portion having a second height; and
    etching the first and second semiconductor layers and the data metal layer using the third sub photoresist pattern as an etch stopping layer.

15. The method of claim 14, wherein forming the input terminal of the switching element, the output terminal of the switching element and the data line comprises:
    etching the third sub photoresist pattern to form a third photoresist pattern exposing the data metal layer; and
    etching the first and second semiconductor layers and the data metal layer using the third photoresist pattern as an etching stopping layer to expose the first semiconductor layer.

16. The method of claim 15, wherein the third photoresist pattern is patterned using a second mask, and the second mask includes a blocking portion disposed over the input and output terminals of the switching element and a transflective portion disposed over the semiconductor pattern between the input and output terminals of the switching element.

17. The method of claim 11, further comprising forming a gate insulation layer covering the gate line, the common electrode line and the control terminal of the switching element.

18. The method of claim 17, wherein forming the first hole comprises partially removing the gate insulation layer disposed over the common electrode line.

19. The method of claim 11, wherein sequentially forming the first pixel electrode and the insulation layer comprises:
- forming a second transparent electrode layer on the insulation substrate on which the switching element is formed;
- patterning the second transparent electrode layer to form the first pixel electrode directly making contact with an output terminal of the switching element; and
- forming the insulation layer on the insulation substrate on which the first pixel electrode is formed.

20. The method of claim 1, wherein each of the first and second photoresist layers includes a photo sensitive material.

* * * * *